United States Patent [19]

Lind et al.

[11] Patent Number: 4,805,739
[45] Date of Patent: Feb. 21, 1989

[54] ELEVATOR CONTROL SWITCH AND POSITION INDICATOR ASSEMBLY

[75] Inventors: Larry W. Lind; Richard E. Watt, both of La Mesa, Calif.

[73] Assignee: U.S. Elevator Corporation, San Diego, Calif.

[21] Appl. No.: 143,943

[22] Filed: Jan. 14, 1988

[51] Int. Cl.⁴ .............................................. B66B 3/00
[52] U.S. Cl. .................................... 187/121; 187/136
[58] Field of Search ............... 187/121, 130, 135, 136; 361/207

[56] References Cited

U.S. PATENT DOCUMENTS

| | | | |
|---|---|---|---|
| 2,525,768 | 10/1950 | Bruns | 187/121 X |
| 2,525,769 | 10/1950 | Bruns | 187/121 X |
| 2,738,489 | 3/1956 | Borden | 187/121 |
| 3,777,093 | 12/1973 | Sterns et al. | 361/207 X |
| 3,952,837 | 4/1976 | Rice | 187/121 |
| 3,989,964 | 11/1976 | Gikow et al. | 361/207 X |
| 4,120,381 | 10/1978 | Otto et al. | 187/121 |
| 4,134,107 | 1/1979 | Miller et al. | 187/121 |

Primary Examiner—William M. Shoop, Jr.
Assistant Examiner—W. E. Duncanson, Jr.
Attorney, Agent, or Firm—Brown, Martin, Haller & McClain

[57] ABSTRACT

An elevator control switch and position indicator assembly for mounting on a panel comprises a piezoelectric element and a control circuit connected to the element for generating an elevator control pulse in response to an output signal from the element. A push button assembly is arranged such that when the push button is operated, a force is applied to the piezoelectric element, and the push button assembly is restrained so that it can only deflect the element a predetermined distance sufficient to produce an output signal. The assembly further comprises an integral indicator device for providing an indication to the operator that an elevator control signal has been generated. The invention also can be configured to provide an indication of the position of an elevator car.

14 Claims, 5 Drawing Sheets

FIG. 6
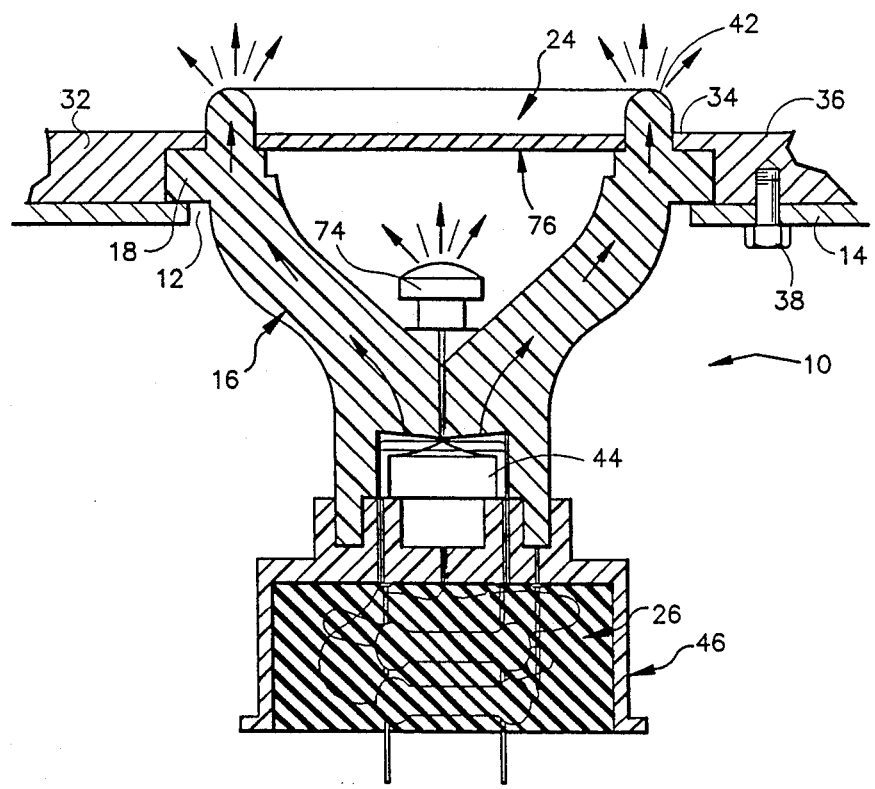
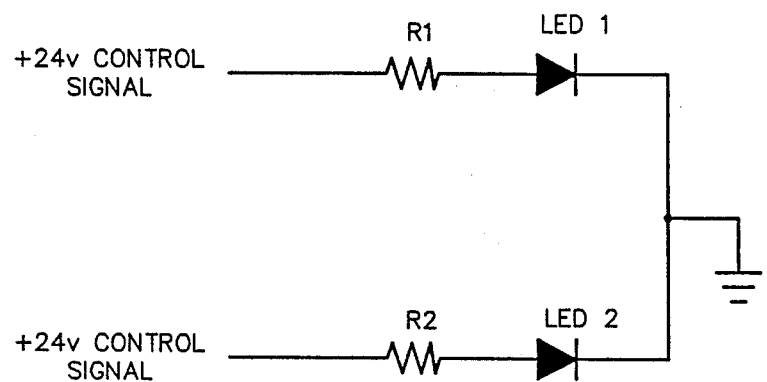
FIG. 7

ELEVATOR CONTROL SWITCH AND POSITION INDICATOR ASSEMBLY

BACKGROUND OF THE INVENTION

The present invention relates generally to elevator switches and position indicators. Such units are normally installed on operating panels in hallways and within elevator cars for allowing the user to select a floor destination, for indicating that the switch has been activated, and for indicating the position of the elevator car.

Elevator switches have up to now mainly been of the simple, mechanical snap-action type in which a button is depressed to close a switch. A significant problem with this type of switch is its susceptibility to vandalism, since objects such as toothpicks, match sticks and the like can be jammed between the button and housing when the button is pressed so that the switch is permanently closed. This causes the elevator to return constantly to a particular floor, for example. When this happens, maintenance personnel have to perform a lengthy check of the system to discover the source of the problem, and such vandalism substantially increases the cost of operating an elevator system.

Maintenance personnel must also cope with the task of replacing light bulbs in mechanical switches that have burned out. Such activity also increases the cost of operating the elevator system.

SUMMARY OF THE INVENTION

It is an object of the present invention to provide improved control switch and elevator position indicator assemblies.

According to the present invention, a control switch assembly is provided which comprises a switch housing for mounting in a panel, the housing having an opening at one end, and a switch device mounted in the housing. The device comprising a piezoelectric element for generating an output signal on deflection and a control circuit for generating an elevator control pulse in response to an output signal from the element. A push button assembly mounted at the open end of the housing is connected to the piezoelectric element and is arranged to deflect the piezoelectric element on application of force to the button by an operator. The push button assembly is restrained so that it can only deflect the element a predetermined distance necessary to produce an output signal. This reduces or prevents the risk of damage to the piezoelectric element as a result of the operator applying too much force to the element.

The force required to produce an output signal from a piezoelectric element is very small. A controlled deflection is typically of the order of 0.005 inches. A very light touch of the button is sufficient to operate the switch.

The risk of vandalism is reduced by sealing the push button assembly in a compact mechanical package so that there will be no access for foreign objects to initiate switch operation.

In a first preferred embodiment of the invention, the switch housing is an integrated indicator device which provides an indication to the operator that an elevator control signal has been generated. This may be any type of lighting element for illuminating the push button, for example, with acknowledgment of the push button switch action being made by a latched positive signal from the associated elevator controller activating the lighting element.

In this preferred embodiment of the invention, the indicator device is a lens guide assembly and comprises a light emitting ring surrounding the outer edge of the push button and a light source for illuminating the ring. The light source preferably comprises a light emitting diode (LED) with a suitable lens assembly for directing light from the LED to the lens ring.

Also, in this preferred embodiment of the invention, the housing includes a safety stop mounted below the piezoelectric element. The gap between the lower surface of the piezoelectric element and the top of the safety stop allows movement of the piezoelectric element for a distance corresponding to the predetermined deflection of the piezoelectric element. Thus, the push button assembly is restrained and limited in axial movement to a distance corresponding to the gap between the piezoelectric element and the stop.

In a preferred arrangement, the LED is held in place near the bottom of the lens guide assembly by a potting cup. To provide connections to the piezoelectric element, the cup and the lens guide assembly have matched openings so that suitable electrical connection can be made to the electronic components mounted in the cup. A potting compound is used to fill the cavity in the cup where the electronic components are installed to protect the components from environmental damage.

In the second embodiment, a second LED is placed in the cavity of the lens guide assembly. This LED is illuminated to indicate the position of the elevator car. The assembly in this arrangement includes a translucent graphic disk instead of the operator button. No stop is required here as in the preferred embodiment.

BRIEF DESCRIPTION OF THE DRAWINGS

The present invention will be better understood from the following detailed description of a preferred embodiment of the invention, taken in conjunction with the accompanying drawings in which like reference numerals refer to like parts and in which:

FIG. 6 is a vertical cross section through a second preferred embodiment where the invention operates as an elevator car position indicator; and FIG. 7 is a schematic of the elevator car position indicator.

DESCRIPTION OF THE PREFERRED EMBODIMENTS

Figure 1:
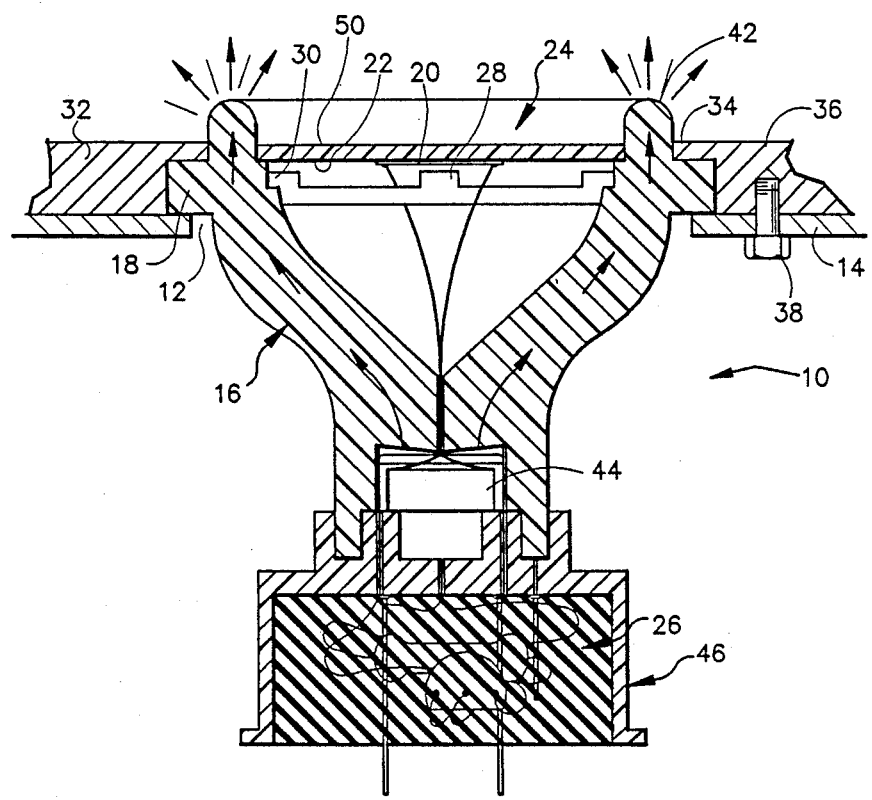
FIG. 1 is a vertical cross section through a first preferred embodiment of a control switch assembly according to the present invention.

FIG. 1 of the drawings shows an elevator control switch assembly 10 according to a first preferred embodiment of the present invention. The assembly 10 is mounted in a suitable opening 12 in an elevator operating panel 14, and comprises a lens guide 16 which extends through the opening 12 and has an open outer end which projects out of the opening. The lens guide 16 has a lip or shoulder 18 which rests on the operating panel 14 around the opening 12 to retain the lens guide in position. A push button assembly 24 is placed at the open end of the lens guide. The push button assembly 24 includes a push button 50 and a switch device 20.

In the first preferred embodiment of the invention, the switch device 20 comprises an electromechanical transducer device for transforming a mechanical force applied to the device into an electrical signal. The device preferably comprises a piezoelectric element, suitably of ceramic material, which will produce a voltage across its electrodes of the general form shown in the upper part of FIG. 3 when it is displaced in a direction normal to its flat surface. A first pulse will be generated when a tensile strain is produced on deflection of the element, and a second pulse of opposite polarity will be generated when the force is removed as a result of the compressive strain when the element rebounds.

The piezoelectric element 20 is preferably installed on the inner face 22 of the push button 50, as shown in FIG. 1. A bonding material such as Dow Corning Silastic 734 RTV (room temperature vulcanizing) self-leveling compound is applied to the piezoelectric element 20 and the push button 50.

Suitable electronic pulse shaping components 26 connected to the piezoelectric element 20 form a control circuit for generating a suitable elevator control pulse for connection to an elevator controller of the standard type. A suitable pulse shaping control circuit is illustrated schematically in FIG. 2.

The push button assembly 24 is mounted at the open end of the lens guide 16. The lens guide 16 is installed on the operating panel 14 by a bezel or restraining plate 32. Bezel 32 has a rim 34 which projects over the outer end of the lens guide 16 and over the rim or shoulder 18 on the lens guide to hold it in place. Preferably, the bezel 32 is secured by internal screws 38 on the inner face of the operating panel 14 to restrict access to the interior of the elevator control switch assembly by anyone but authorized service personnel, and also to provide a smooth exterior surface on the bezel with no weld studs or other deformation of the mounting surface. A braille or switch position indication insert can be accommodated on the bezel.

Axial movement of the push button assembly is restricted by a safety stop 28 at the upper end of the lens guide 16. The safety stop 28 is constructed of any suitable material and is installed on a shelf or ledge 30 that is molded into the lens guide 16. The stop 28 may be placed in any suitable location on shelf 30, but is typically aligned with the operator button 50 along the lens guide's longitudinal axis. The push button assembly 24 can only move axially to the extent allowed by the gap between the bottom surface of the piezoelectric element 20 and the top surface of stop 28. The allowed movement is limited to an amount just sufficient to produce an output signal from the piezoelectric element 20. In the first preferred embodiment of the invention, the space provided between the piezoelectric element and the stop is approximately 0.005 inches. A range of 0.005 inches to 0.010 inches can be utilized to properly operate the switch. This will reduce or avoid the risk of damage to the piezoelectric element as a result of excessive force being applied to the push button.

The control switch assembly 10 incorporates an integral indicator device for providing an indication to the operator that an elevator control signal has been generated. In the preferred embodiment of the invention shown in FIG. 1, the indicator device comprises a light emitting ring 42 and a light source such as a light emitting diode (LED) 44 for illuminating the ring 42. The LED preferably has multiple elements for increased luminous intensity. As shown in FIG. 1, the light emitting diode 44 is positioned near the bottom of lens guide 16 by a potting connector 46. Lens guide 16 extends between the LED 44 and the lens ring 42 for guiding light emitted from the LED 44 to the ring 42. The lens guide 16 forms a generally annular cross section lens for guiding light to the ring 42 and is suitably fabricated from optical grade polycarbonate. The LED 44 will be connected to the electronic control circuitry 26 to receive a latched signal from the elevator controller to acknowledge switch action, as explained below in connection with FIG. 2. The potting connector 46 and lens guide 16 have matched openings to permit the piezoelectric element wires to exit the lens guide and be soldered to the electronic components 26.

The push button assembly 24 can be pushed anywhere on the exposed surface of button 50 to apply force to the piezoelectric element 20 and thus initiate an elevator control signal. Since the piezoelectric element 20 is integrally mounted on the operator button 50, the entire piezoelectric element 20 will be subject to any applied force and will deflect slightly on depression of the button. When the operator button is released, the piezoelectric element will return it to its original position shown in FIG. 1. The switch is operated with minimal force, corresponding to a very light touch of the operator on the exposed surface of the assembly.

Figure 2:
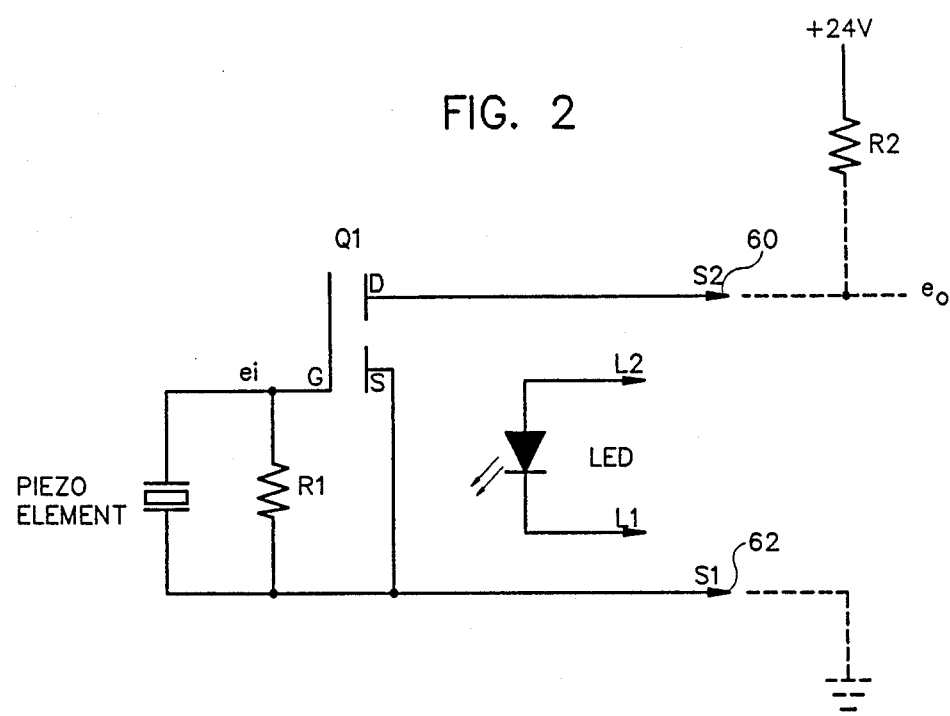
FIG. 2 is a schematic of the elevator control switch for generating a control pulse from the output of the piezoelectric element.

A suitable control circuit for producing an elevator control pulse from the output of the piezoelectric element is shown in FIG. 2. The components of this circuit will be suitably mounted in the potting connector 46. Input and output pins (printed circuit pins) from the circuit extend from the electronic components 26 for connection to the elevator controller.

Figure 4:
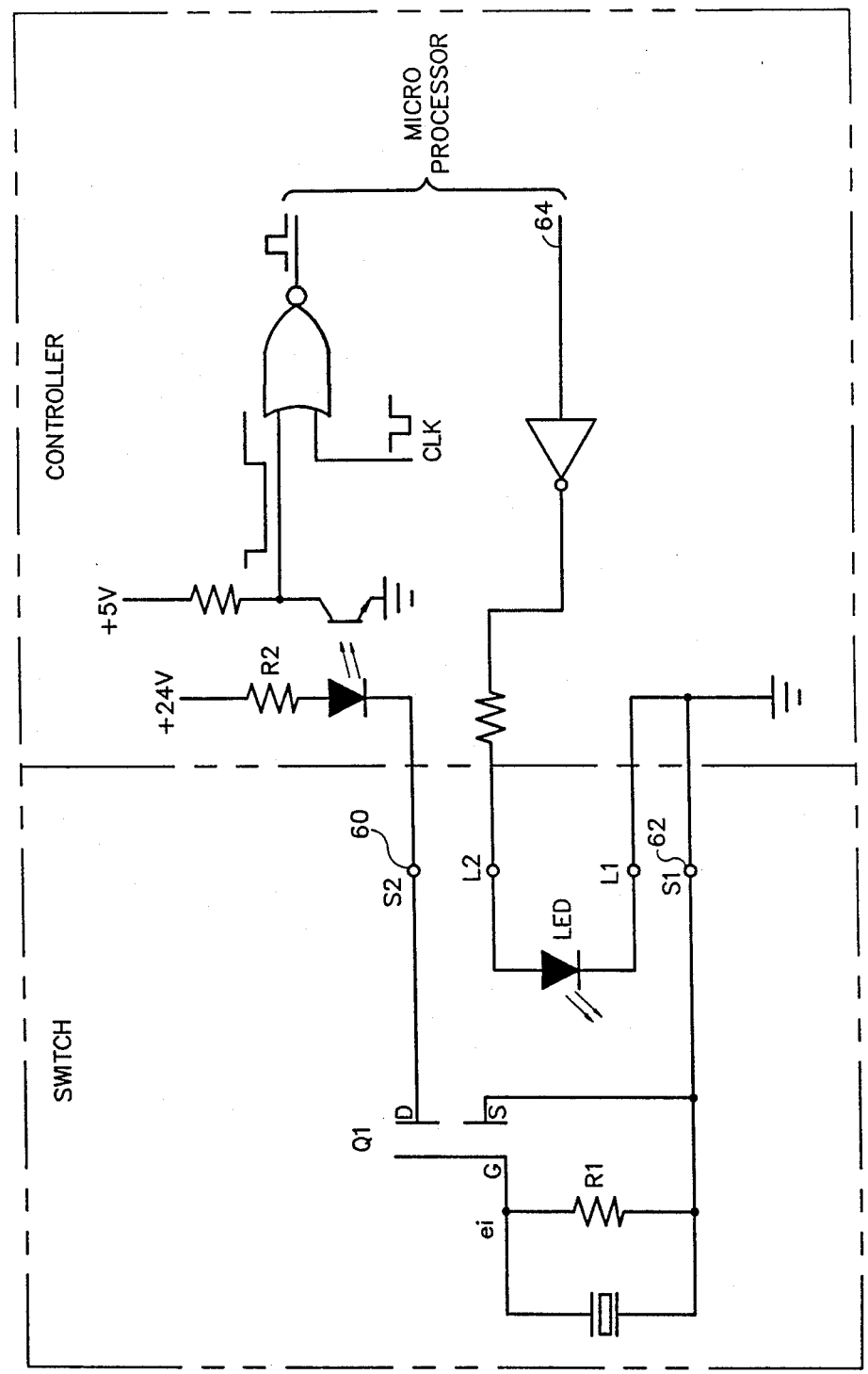
FIG. 4 is a schematic of the switch circuit with a typical electronic controller interface.
Figure 5:
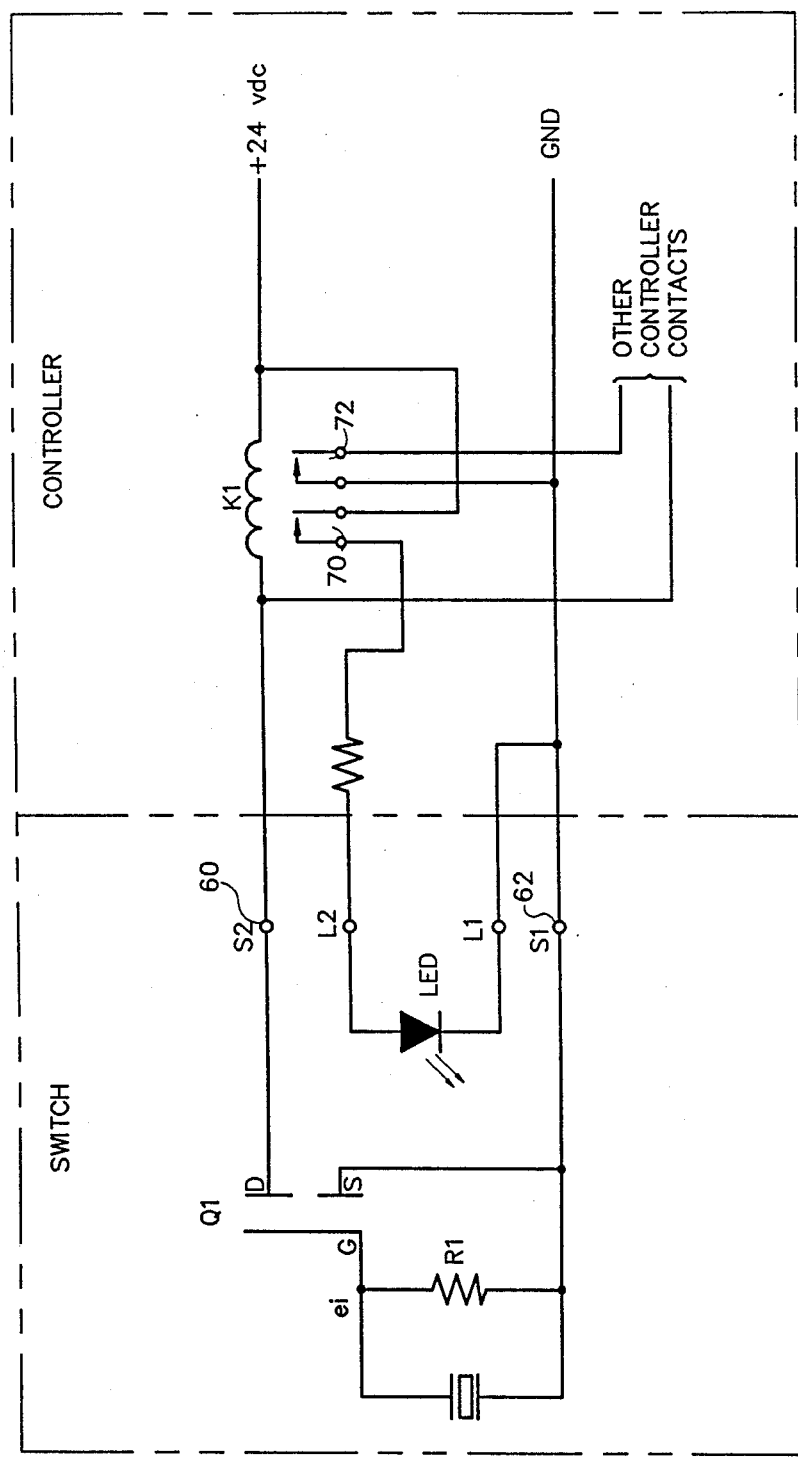
FIG. 5 is a schematic of the switch circuit with a typical relay controller interface.

As shown in FIGS. 2, 4 and 5, one of the electrodes (the ceramic electrode) of the ceramic element 20 is connected to the gate of a MOSFET Q1, and the other electrode is connected to ground. Resistor R1 is connected in parallel to ceramic element 20. The drain of MOSFET Q1 is connected through terminal connection S2 to suitable control and relay interface circuits (see FIGS. 4 and 5), which yields a negative going source output 60. The source of MOSFET Q1 is connected through terminal connection S1 to the control and relay interface circuit ground 62. Acknowledgment of push button switch action is made by a latched positive signal connected to the LED on line 64.

Figure 3:
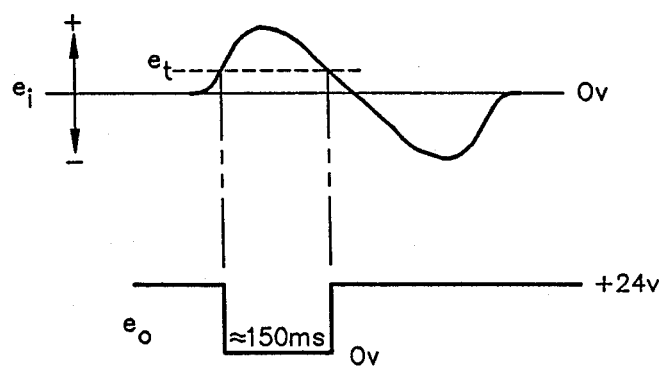
FIG. 3 is a wave diagram showing the output of the piezoelectric element and a corresponding pulse generated at an intermediate point in the circuit of FIG. 2.

As shown in FIG. 3, when the operator button is depressed applying a displacement force to the transducer element, a voltage $e_i$ will appear across the transducer electrodes. This is applied to the FET's gate, and as this voltage exceeds the FET's threshold voltage $e_t$, the FET is turned on and the drain voltage $e_o$ becomes close to a ground potential. When the force causing the transducer displacement is removed, the element rebounds, generating a voltage of the opposite polarity as shown at the top of FIG. 3. These negative output pulses are used as control inputs to conventional relay logic circuits and microprocessor input circuits to operate the elevator, in the conventional manner, as illustrated in FIGS. 4 and 5.

In the first preferred embodiment, the elevator control switch assembly has a circular outer cross section, but alternative cross sections such as square may be used.

The operator button is illuminated by a long-life, multiple element LED which provides an external halo surrounding the operator button, rather than by a relatively short-lived bulb as in previous designs. Thus, a more reliable indication of switch operation is provided.

Access to the rear of the switch assembly is restricted by the bezel plate, which is rear mounted on the control panel so that it can only be removed by maintenance personnel with access to the interior of the panel. This will also provide a smoother appearance to the front face of the control panel, with no weld studs or screws being visible.

The operator button is restrained so that the risk of damage to the switch element as a result of excessive pressure applied to the button is limited. The switch assembly is not attitude sensitive and will not become inoperative at high or low extreme temperatures ranging from 32° F. to 200° F. The operator button 50 can be made from a variety of materials, as desired.

In a second preferred embodiment, the invention comprises substantially the same mechanical components as in the control switch assembly and operates as an elevator car position indicator. See FIG. 6.

As in the switch assembly of the first preferred embodiment, an LED 44 illuminates the light ring 42 to yield a halo effect. A second LED 74 illuminates a translucent graphic disk 76. Typically, the disk is labeled with the numbers of floors of a building, but can include numerals, letters or other graphic information. The graphic disk 76 is bonded into the lens guide 16 with RTV and is positioned in the same place as the operator button 50 in the preferred embodiment. In the second arrangement, however, no piezoelectric element 20 and stop 28 are needed.

Electrical connection to LED 74 is made through the matched openings in lens guide 16 in the same manner that wires are connected to the piezoelectric element in the control switch assembly.

As shown in the schematic diagram of FIG. 7, the circuits for the two LEDs are kept separate so that, if desired, one LED can be operated for a continuous period while the other LED is pulsed. The two LEDs may also be of different colors.

Thus, the elevator control switch and position indicator assemblies of this invention have significantly improved resistance to vandalism, have all electronic circuitry and integral LED illumination, for long service-free operation.

Although two preferred embodiments of the invention have been described above by way of example, it will be understood by those skilled in the field that modifications may be made to the disclosed embodiment without departing from the scope of the invention, which is defined by the appended claims.

What is claimed is:

1. An elevator control switch assembly, comprising:
   a lens guide having an opening at one end;
   means for mounting said lens guide in an operating panel with its open end facing outwardly;
   switch means mounted in said lens guide, comprising
   a piezoelectric element for generating an output signal on application of force to said piezoelectric element;
   control means connected to said piezoelectric element for generating an elevator control pulse in response to an output signal from said piezoelectric element;
   push button means mounted in said lens guide for deflecting said piezoelectric element to generate an output signal on application of force to said push button means by an operator, the push button means being movable a predetermined distance between a first inoperative position and a second operative position in which it deflects the piezoelectric element; and
   restraining means for limiting movement of said push button means to a predetermined distance sufficient to produce an output signal from said piezoelectric element.

2. The elevator control switch assembly as claimed in claim 1, wherein said restraining means further comprises a stop positioned below said piezoelectric element, said stop limiting inward axial movement of said push button means to a predetermined distance.

3. The elevator control switch assembly as claimed in claim 2, wherein said assembly further comprises a bezel plate for mounting over the open end of said lens guide and means for releasably securing said bezel plate to an operating panel, said bezel plate comprising:
   a central opening for alignment with the open end of said lens guide; and
   a rim surrounding the opening for projecting inwardly over the outer end of said lens guide to retain said lens guide on said operating panel.

4. The elevator control switch assembly as claimed in claim 1, wherein movement of said push button means if limited to no more than 0.010 inches.

5. The elevator control switch assembly as claimed in claim 1, wherein said lens guide further comprises:
   an integral indicator device for indicating generation of a control pulse by actuation of said switch assembly, said indicator device comprising light emitting means for generating a light signal; and
   means for connecting said light emitting means to an elevator controller to actuate said light emitting means in response to reception of an elevator control pulse from said switch assembly.

6. The elevator control switch assembly as claimed in claim 5, wherein said light emitting means is formed integrally with said push button means, said light emitting means comprising:
   a display ring at the outer end of said push button means;
   a light source at the inner end of said push button means; and
   lens means for transmitting light from said light source to illuminate said ring.

7. The elevator control switch assembly as claimed in claim 6, wherein said light source comprises at least one light emitting diode element.

8. The elevator control switch assembly as claimed in claim 1, wherein said control means comprises a circuit mounted in a potting connector mounted at the inner end of said lens guide.

9. An elevator position indicator assembly, comprising:
   a lens guide having an opening at one end;
   means for mounting said lens guide in an operating panel with its open end facing outwardly;
   control means connected to said lens guide for receiving an elevator position indicator signal in response to an external signal; and indicator means mounted onto the lens guide for indicating graphic information in response to an output signal from said control means.

10. The elevator position indicator assembly as claimed in claim 9, wherein said assembly further comprises a bezel plate for mounting over the open end of said lens guide and means for releasably securing said bezel plate to an operating panel, said bezel plate comprising:
 a central opening for alignment with the open end of said lens guide; and
 a rim surrounding the opening for projecting inwardly over the outer end of said lens guide to retain said lens guide on said operating panel.

11. The elevator position indicator assembly as claimed in claim 9, wherein said lens guide further comprises:
 an integral indicator device for indicating generation of said elevator position indicator signal, the indicator device comprising light emitting means for generating a light signal; and
 means for connecting said light emitting means to an elevator controller to actuate said light emitting means in response to reception of an elevator position indicator signal.

12. The elevator position indicator assembly as claimed in claim 9, wherein said light emitting means is formed integrally with said indicator means, said light emitting means comprising:
 a display ring at the outer end of said indicator means;
 a light source at the inner end of said lens guide; and
 lens means for transmitting light from said light source to illuminate said ring.

13. The elevator position indicator assembly as claimed in claim 12, wherein said light source comprises at least one light emitting diode element.

14. The elevator position indicator assembly as claimed in claim 9, wherein said control means comprises a circuit mounted in a potting connector mounted at the inner end of said lens guide.

* * * * *